United States Patent
Libbert et al.

(10) Patent No.: US 9,281,233 B2
(45) Date of Patent: Mar. 8, 2016

(54) METHOD FOR LOW TEMPERATURE LAYER TRANSFER IN THE PREPARATION OF MULTILAYER SEMICONDUCTOR DEVICES

(71) Applicant: SunEdison, Inc., St. Peters, MO (US)

(72) Inventors: Jeffrey L. Libbert, O'Fallon, MO (US); Michael John Ries, St. Charles, MO (US)

(73) Assignee: SunEdison Semiconductor Limited, Singapore (SG)

( * ) Notice: Subject to any disclaimer, the term of this patent is extended or adjusted under 35 U.S.C. 154(b) by 0 days.

(21) Appl. No.: 14/133,893

(22) Filed: Dec. 19, 2013

(65) Prior Publication Data

US 2014/0187020 A1    Jul. 3, 2014

Related U.S. Application Data

(60) Provisional application No. 61/746,822, filed on Dec. 28, 2012.

(51) Int. Cl.
*H01L 21/46*    (2006.01)
*H01L 21/762*   (2006.01)

(52) U.S. Cl.
CPC .............................. *H01L 21/76254* (2013.01)

(58) Field of Classification Search
CPC .................................................. H01L 21/76254
USPC .......................................................... 438/458
See application file for complete search history.

(56) References Cited

U.S. PATENT DOCUMENTS

| | | | |
|---|---|---|---|
| 2007/0037363 A1 | 2/2007 | Aspar et al. | |
| 2007/0212852 A1 | 9/2007 | Tauzin et al. | |
| 2008/0014714 A1* | 1/2008 | Bourdelle et al. | 438/455 |
| 2010/0127343 A1 | 5/2010 | Daigler et al. | |
| 2011/0159665 A1* | 6/2011 | Witte et al. | 438/458 |

OTHER PUBLICATIONS

International Search Report and Written Opinion of the International Search Authority regarding PCT/US2013/077491 mailed on Apr. 22, 2014; 8 pgs.

* cited by examiner

*Primary Examiner* — Bradley K Smith
(74) *Attorney, Agent, or Firm* — Armstrong Teasdale LLP

(57) ABSTRACT

A method of preparing a monocrystalline donor substrate, the method comprising (a) implanting helium ions through the front surface of the monocrystalline donor substrate to an average depth $D_1$ as measured from the front surface toward the central plane; (b) implanting hydrogen ions through the front surface of the monocrystalline donor substrate to an average depth $D_2$ as measured from the front surface toward the central plane; and (c) annealing the monocrystalline donor substrate at a temperature sufficient to form a cleave plane in the monocrystalline donor substrate. The average depth $D_1$ and the average depth $D_2$ are within about 1000 angstroms.

13 Claims, No Drawings

US 9,281,233 B2

METHOD FOR LOW TEMPERATURE LAYER TRANSFER IN THE PREPARATION OF MULTILAYER SEMICONDUCTOR DEVICES

CROSS REFERENCE

This application claims priority from U.S. Provisional Application Ser. No. 61/746,822 filed on Dec. 28, 2012, the disclosure of which is incorporated herein as if set forth in its entirety.

FIELD OF THE INVENTION

The present invention relates generally to a method of preparing multilayer semiconductor devices. More particularly, the present invention relates to a method of preparing a donor substrate prior to bonding to a carrier substrate.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g. silicon wafers) may be utilized in the preparation of composite layer structures. A composite layer structure (e.g., an SOI structure) generally comprises a carrier wafer or layer, a device layer, and an insulating (i.e., dielectric) film (typically an oxide layer) between the carrier layer and the device layer. Generally, the device layer is between 0.05 and 20 micrometers thick. In general, composite layer structures, such as silicon on insulator (SOI), silicon on sapphire (SOS), and silicon on quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the carrier wafer and then slowly etched away until only a thin layer of silicon on the carrier wafer remains. (See, e.g., U.S. Pat. No. 5,189,500, which is incorporated in its entirety herein by reference.) This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a carrier wafer to form a bonded wafer through a hydrophilic bonding process. The donor wafer and/or carrier wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor wafer and carrier wafer hydrophilic. The wafers are then pressed together and a bond is formed there between. This bond is relatively weak, and must be strengthened before further processing can occur.

In some processes, the hydrophilic bond between the donor wafer and carrier wafer (i.e., a bonded wafer) is strengthened by heating or annealing the bonded wafer pair at temperatures between approximately 300° C. and 500° C. The elevated temperatures cause the formation of covalent bonds between the adjoining surfaces of the donor wafer and the carrier wafer, thus solidifying the bond between the donor wafer and the carrier wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C. For dissimilar materials (silicon on sapphire or silicon on quartz) this temperature can be too high for the substrates to survive the stresses induced by the mismatch in thermal expansion coefficient. Several methods of lowering the temperature necessary to induce splitting have been discussed in the literature, among them increasing hydrogen dose and co-implanting hydrogen ions and boron ions. Higher doses of H requires longer implant times, leading to higher costs. When co-implanting boron and hydrogen, additional steps may be required to remove the excess boron in the transferred layer since this can lead to undesirable changes to the resistivity of the top layer.

BRIEF DESCRIPTION OF THE INVENTION

Among the aspects of the present invention may be noted a method of preparing a monocrystalline donor substrate comprising two major, generally parallel surfaces, one of which is a front surface of the donor substrate and the other of which is a back surface of the donor substrate, a circumferential edge joining the front and back surfaces, and a central plane between the front and back surfaces. The method comprises (a) implanting helium ions through the front surface of the monocrystalline donor substrate to an average depth $D_1$ as measured from the front surface toward the central plane; (b) implanting hydrogen ions through the front surface of the monocrystalline donor substrate to an average depth $D_2$ as measured from the front surface toward the central plane; and (c) annealing the monocrystalline donor substrate at a temperature sufficient to form a cleave plane in the monocrystalline donor substrate. The average depth $D_1$ and the average depth $D_2$ are within about 1000 angstroms.

The present invention is still further directed to a method of preparing a monocrystalline silicon substrate comprising two major, generally parallel surfaces, one of which is a front surface of the silicon substrate and the other of which is a back surface of the silicon substrate, a circumferential edge joining the front and back surfaces, and a central plane between the front and back surfaces. The method comprises the following steps in order: (a) implanting helium ions through the front surface of the monocrystalline silicon substrate to an average depth $D_1$ as measured from the front surface toward the central plane; (b) implanting hydrogen ions through the front surface of the monocrystalline donor substrate to an average depth $D_2$ as measured from the front surface toward the central plane; and (c) annealing the monocrystalline silicon substrate at a temperature sufficient to form a cleave plane in the monocrystalline silicon substrate, the cleave plane having an average depth equal to $D_1$, $D_2$, or a value between $D_1$ and $D_2$; and (d) bonding the front surface of the monocrystalline donor substrate having the cleave plane therein to a surface of a carrier substrate to thereby form a bonded structure, wherein the carrier substrate is a semiconductor wafer comprising a material selected from the group consisting of silicon, sapphire, quartz, gallium-arsenic, silicon carbide, silicon germanium, and germanium.

DETAILED DESCRIPTION OF THE INVENTION

The present invention is directed to a method for preparing a composite layer structure. The method of the present invention advantageously enables low temperature anneal after bonding the donor substrate and the carrier substrate and prior to layer separation. The lower temperature anneal reduces the stresses, such as those arising from differential thermal expansion in structures comprising bonded dissimilar donor and carrier substrates, that may lead to fracture in one or both of the substrates.

According to the method of the present invention, an implant of helium ions and hydrogen ions forms a damage layer in the donor substrate, which is then thermally activated via high temperature anneal. In some embodiments, the method of the present invention utilizes an implant of helium ions followed by an implant of hydrogen ions to form a damage layer in the donor substrate, which is followed by a relatively high temperature anneal to form a cleave plane. In some embodiments, the method of the present invention utilizes simultaneous co-implant of hydrogen ions and helium ions to form a damage layer in the donor substrate, which is followed by a relatively high temperature anneal to form a cleave plane. In some embodiments, the method of the present invention utilizes an implant of hydrogen ions followed by an implant of helium ions to form a damage layer in the donor substrate, which is followed by a relatively high temperature anneal to form a cleave plane. In preferred embodiments, a high temperature anneal occurs after implanting helium and hydrogen ions in the donor substrate and prior to wafer bonding. Since the donor substrate is not bonded to another substrate (e.g., the carrier substrate) the anneal can take place at temperature that is higher than might be allowed if it were performed on a bonded pair of dissimilar materials such as, for example, silicon and sapphire. Not being held to any particular theory, the evolution of the cleave plane appears to be a thermally activated process. Therefore, the ability to begin the cleave plane formation at a higher temperature prior to bonding may greatly reduce the time and stress needed to enable fracture along the cleave plane during the bonding anneal.

The substrates for use in the present invention include a monocrystalline donor substrate and a carrier substrate. In general, the monocrystalline donor substrate comprises two major, generally parallel surfaces, one of which is a front surface of the substrate and the other of which is a back surface of the substrate, a circumferential edge joining the front and back surfaces, and a central plane between the front and back surfaces. Prior to any operation as described herein, the front surface and the back surface of the substrate may be substantially identical. A surface is referred to as a "front surface" or a "back surface" merely for convenience and generally to distinguish the surface upon which the operations of method of the present invention are performed. As described throughout this specification, the operation, e.g., ion implantation, oxygen plasma activation, etc., is stated to occur on the front surface of the substrate. This naming convention does not exclude carrying out identical such operations, or different operations, on the back surface of the donor substrate.

In some embodiments, the monocrystalline donor substrate comprises a semiconductor wafer. In preferred embodiments, the semiconductor wafer comprises a material selected from the group consisting of silicon, gallium arsenide, gallium nitride, aluminum gallium nitride, indium phosphide, silicon carbide, silicon germanium, germanium, and combinations thereof. In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference).

In some embodiments, the major surfaces of the donor wafer may be untreated prior to the operations of the method of the present invention. That is, the donor wafer may be sliced and polished, but are not further treated to have an oxidizing or nitriding layer. In some embodiments, the donor wafer comprise no more than a native silicon oxide layer. In some embodiments, one of more of the major surfaces of the donor wafer may be oxidized prior to ion implantation. In preferred embodiments, the front surface layer, i.e., the layer through which helium and hydrogen ions are implanted is oxidized prior to ion implantation. It is desirable to have a thermal interface at the top Silicon/BOX interface to keep interface density low. The donor wafer should not be oxidized at an elevated temperature after the implant, which may cause wafer blister. In some embodiments, one of more of the major surfaces of the donor wafer may be nitrided prior to ion implantation. In preferred embodiments, the front surface layer, i.e., the layer through which helium and hydrogen ions are implanted is nitrided prior to ion implantation.

The donor wafer may be thermally oxidized in a furnace such as an ASM A400. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprises a mixture of inert gas, such as Ar or $N_2$, and oxidizing gases, such as $O_2$ and water vapor (a "wet oxidation"). In an exemplary embodiment, donor wafers may be loaded into a vertical furnace, such as an A400. The temperature is ramped to the oxidizing temperature with a mixture of $N_2$ and $O_2$. At the desired temperature water vapor is introduced into the gas flow. After desired oxide thickness has been obtained, the water vapor and $O_2$ are turned off and the furnace temperature is reduced and wafers are unloaded from the furnace.

After oxidation, wafer cleaning is optional. If desired, the wafers can be cleaned, for example, in a standard SC1/SC2 solution.

According to the method of the present invention, a donor substrate, such as a semiconductor wafer, that has been etched and polished and optionally oxidized, is subjected to ion implantation to form a damage layer in the donor substrate. Ion implantation may be carried out in a commercial available instrument, such as an Applied Materials Quantum II. In some embodiments, the method comprises implanting helium ions (e.g., He ions) through the front surface of the monocrystalline donor substrate to an average depth $D_1$ as measured from the front surface toward the central plane. The average depth, $D_1$, of implanted helium ions may range from about 0.02 micrometers to about 1 micrometers, which depends upon the desired thickness of the transferred layer. The desired depth of the helium ion implant may be considered relative to the peak of the hydrogen implant since the hydrogen implant layer plays the major role in setting the eventual transferred layer depth. Preferably, the He implant peak concentration should be within about +/−1000 angstroms of the peak of the hydrogen implant, more preferably within about +/−500 angstroms, and still more preferably within about +/−100 angstroms of the peak of the hydrogen implant. In some embodiments, the total helium ion implantation dosage may range from about $0.5 \times 10^{16}$ helium ions/$cm^2$ to about $2 \times 10^{16}$ helium ions/$cm^2$, preferably about $1 \times 10^{16}$ helium ions/$cm^2$. Helium implantation generally occurs at an implant energy sufficient to achieve the desired He implant depth, such as between about 10 keV and about 50 keV, such as about 20 keV to about 40 keV, such as about 27 keV or about 36 keV.

In some embodiments, the method comprises implanting hydrogen ions (e.g., $H^+$ ions) through the front surface of the monocrystalline donor substrate to an average depth $D_2$ as measured from the front surface toward the central plane. The average depth, $D_2$, of implanted hydrogen ions may range from about 0.02 micrometers to about 1 micrometers. In some embodiments, the total hydrogen ion implantation dosage may range from about $0.5 \times 10^{16}$ hydrogen ions/$cm^2$ to about $3 \times 10^{16}$ hydrogen ions/$cm^2$, preferably about $1 \times 10^{16}$ hydrogen ions/$cm^2$. Hydrogen implantation generally occurs at an implant energy sufficient to achieve the desired hydrogen ion implant depth, such as between about 20 keV and about 60 keV, such as between about 30 keV and about 50 keV, such as about 37 keV or about 48 keV.

The helium implant may occur before, simultaneously with, or after the hydrogen implant. In preferred embodiments, the helium implant occurs prior to the hydrogen implant.

In some embodiments it may be desirable to subject wafers to a clean after the implant. In some preferred embodiments, the clean could include a Piranha clean followed by an DI water rinse and SC1/SC2 cleans.

In some embodiments of the present invention, the monocrystalline donor substrate having a damage layer therein formed by helium ion and hydrogen ion implant is annealed at a temperature sufficient to form a thermally activated cleave plane in the monocrystalline donor substrate. An example of a suitable tool might be a simple Box furnace, such as a Blue M model. In some preferred embodiments, the implanted donor structure is annealed at a temperature of from about 200° C. to about 350° C., from about 225° C. to about 325° C., preferably about 300° C. Thermal annealing may occur for a duration of from about 2 hours to about 10 hour, preferably a duration of about 8 hours. Thermal annealing within these temperatures ranges is sufficient to form a thermally activated cleave plane corresponding to the damage layer formed by the co-implant of hydrogen and helium. In some embodiments, the cleave plane has an average depth substantially equal to $D_1$ and $D_2$, which are in the preferred embodiment of substantially equal distance from the front surface of the wafer.

After the thermal anneal to activate the cleave plane, the monocrystalline donor substrate surface is preferably cleaned.

In some preferred embodiments of the invention, the cleaned monocrystalline donor substrate having the thermally activated cleave plane therein is subjected to oxygen plasma surface activation. In some embodiments, the oxygen plasma surface activation tool is a commercially available tool, such as those available from EV Group, such as EVG®810LT Low Temp Plasma Activation System. The donor wafer having the thermally activated cleave plane is loaded into the chamber. The chamber is evacuated and backfilled with $O_2$ to a pressure less than atmospheric to thereby create the plasma. The wafer is exposed to this plasma for the desired time, which may range from about 1 second to about 120 seconds.

Oxygen plasma surface oxidation is performed in order to render the front surface of the monocrystalline donor substrate hydrophilic and amenable to bonding to a carrier substrate. The carrier substrate, like the donor substrate, generally comprises two major, generally parallel surfaces, one of which is a front surface of the substrate and the other of which is a back surface of the substrate, a circumferential edge joining the front and back surfaces, and a central plane between the front and back surfaces. In some embodiments, the carrier substrate comprises a semiconductor wafer. In preferred embodiments, the semiconductor wafer comprises a material selected from the group consisting of silicon, gallium arsenide, silicon carbide, silicon germanium, germanium, lithium niobate ($LiNbO_3$), barium titanate ($BaTiO_3$), and combinations thereof. In particularly preferred embodiments, the semiconductor wafer comprises a wafer sliced from a single crystal silicon wafer which has been sliced from a single crystal ingot grown in accordance with conventional Czochralski crystal growing methods. In some preferred embodiments, the carrier substrate comprises a silicon wafer having an oxidation layer on a surface thereof In some preferred embodiments the front surface of the donor substrate and the front surface of the carrier substrate have substantially identical dimensions. The carrier substrate may also be a material having a substantially different coefficient of thermal expansion that silicon. For example, the carrier substrate may be a sapphire wafer or a quartz wafer. The carrier wafer, e.g., silicon, sapphire, or quartz, may be subjected to an oxidation process and oxygen plasma activation. Stated another way, both front surfaces of the donor wafer and the carrier wafer may be subjected to similar pretreatments and may both contain activated oxidized front surfaces.

The hydrophilic front surface layer of the donor substrate and a hydrophilic surface, e.g., the front surface, of a carrier substrate are next brought into intimate contact to thereby form a bonded structure. Since the mechanical bond is relatively weak, the bonded structure is further annealed to solidify the bond between the donor wafer and the carrier wafer. Advantageously, the method of the present invention employs a thermal anneal prior to bonding the donor substrate and the carrier substrate in order to form the cleave plane, which enables substantially milder conditions during the thermal anneal of the bonded structure. These milder conditions of temperature and duration enable the formation of bonded structures with substantially fewer fractures and other defects, particularly when bonding a donor structure and carrier structure with substantially mismatched coefficients of thermal expansion, such as bonding silicon wafers with sapphire or quartz carriers. The bonded structure may be annealed at a temperature between about 150° C. and about 350° C., such as between about 150° C. and about 300° C., preferably at a temperature of about 225° C. The thermal anneal may have a duration between about 30 minutes hours and about 5 hours, preferably for about 1 hour.

After the thermal anneal, the bond between the donor substrate and the carrier substrate is strong enough to initiate layer transfer via cleaving the bonded structure at the cleave plane. Cleaving may occur according to techniques known in the art. In some embodiments, the bonded wafer may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart.

The disclosed technique may be used for a range of layer transfer applications where it is required to enable layer transfer at a low temperature. These include layer transfer of silicon layers to dissimilar substrates such as sapphire, crystalline or glass quartz or other insulating and semiconducting substrates. The technique may also be used to allow layer transfer of other semiconducting top layers to a substrate if the semiconductor can be ion split. Some examples might be GaAs, SiC, SiGe, or Ge. The applicable heat treatment temperatures and times and dose ranges for these applications are not known at this time.

Having described the invention in detail, it will be apparent that modifications and variations are possible without departing from the scope of the invention defined in the appended claims.

The following non-limiting examples are provided to further illustrate the present invention.

EXAMPLE

The starting donor and carrier wafers were 200 mm diameter P-wafer that were boron doped to resistivity between 9-18 ohm-cm. A 600 angstrom thick oxide layer was grown on the donor wafers using a wet oxidation process.

The oxidized silicon donor wafer was implanted with helium ions to a total dose of about $1.3 \times 10^{16}$ atoms/cm$^2$ using an energy of about 27 KeV. The peak of the He depth profile was calculated to be approximately 2560 angstroms from the oxidized donor surface.

The He implanted silicon wafer was then implanted with hydrogen ions to a total dose of about $1.3 \times 10^{16}$ atoms/cm$^2$ and energy of about 37 keV. The peak of the H profile was calculated to be approximately 2560 A from the oxidized donor surface.

The donor wafer containing the helium and hydrogen implant layer was annealed for about 8 hours at 300° C.

The donor wafer having the cleave plane therein was cleaned in a Piranha clean followed by SC1/SC2, rinse and dry.

The cleaned donor wafer was then activated by oxygen plasma surface activation in an EV Group plasma activation system in preparation for bonding to a second substrate.

The activated donor wafer is then bonded to a second Si substrate and annealed for about 1 h at 225° C.

Following this the bonded pair is mechanically cleaved and layer transfer was achieved.

In view of the above, it will be seen that the several objects of the invention are achieved. As various changes could be made in the above-described process without departing from the scope of the invention, it is intended that all matters contained in the above description be interpreted as illustrative and not in a limiting sense. In addition, when introducing elements of the present invention or the preferred embodiment(s) thereof, the articles "a," "an," "the" and "said" are intended to mean that there are one or more of the elements. The terms "comprising," "including" and "having" are intended to be inclusive and mean that there may be additional elements other than the listed elements.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of preparing a bonded structure, the method comprising the following steps in order:
   (a) implanting helium ions through a front surface of a monocrystalline silicon substrate, wherein the monocrystalline silicon substrate comprises two major, generally parallel surfaces, one of which is the front surface of the monocrystalline silicon substrate and the other of which is the back surface of the monocrystalline silicon substrate, a circumferential edge joining the front and back surfaces, and a central plane between the front and back surfaces, and further wherein the helium ions are implanted to an average depth $D_1$ between about 0.02 micrometers and about 1 micrometer, as measured from the front surface toward the central plane;
   (b) implanting hydrogen ions through the front surface of the monocrystalline donor substrate to an average depth $D_2$ between about 0.02 micrometers and about 1 micrometer, as measured from the front surface toward the central plane and further wherein the average depth $D_1$ and the average depth $D_2$ are within about 1000 angstroms;
   (c) annealing the monocrystalline silicon substrate at a temperature between about 200° C. and about 350° C. for between about 2 hours and about 10 hours to thereby form a cleave plane in the monocrystalline silicon substrate, the cleave plane having an average depth equal to $D_1$, $D_2$, or a value between $D_1$ and $D_2$;
   (d) bonding the front surface of the monocrystalline silicon substrate having the cleave plane therein to a surface of a carrier substrate to thereby form the bonded structure, wherein the carrier substrate is a semiconductor wafer comprising a material selected from the group consisting of silicon, sapphire, quartz, gallium arsenide, silicon carbide, silicon germanium, and germanium; and (e) annealing the bonded structure at a temperature between about 150° C. and about 350° C. for a duration between about 1 hour and about 5 hours.

2. The method of claim 1 wherein steps (a) and (b) are carried out in that order and prior to step (c).

3. The method of claim 1 wherein steps (a) and (b) are carried out simultaneously and prior to step (c).

4. The method of claim 1 wherein the monocrystalline silicon substrate consists of a monocrystalline silicon wafer sliced from a single crystal silicon ingot grown by the Czochralski method.

5. The method of claim 1 wherein the carrier substrate is a silicon wafer.

6. The method of claim 5 wherein the silicon wafer comprises a $SiO_2$ surface layer.

7. The method of claim 1 wherein the carrier substrate is a sapphire wafer.

8. The method of claim 1 wherein the carrier substrate is a quartz wafer.

9. The method of claim 1 wherein the front surface layer comprises an oxidation layer prior to carrying out steps (a) and (b).

10. The method of claim 9 wherein the front surface layer comprises an oxidation layer, and the oxidation layer is bonded to the surface of the carrier substrate.

11. The method of claim 1 further comprising activating the monocrystalline donor substrate having the cleave plane therein via oxygen plasma surface activation, said activating occurring prior to bonding.

12. The method of claim 1 further comprising cleaving the bonded structure along the cleave plane to thereby form a multilayer structure.

13. The method of claim 1 wherein:
in step (a), the helium ions are implanted through the front surface of the monocrystalline silicon substrate at a total helium ion implantation dosage range from about $0.5 \times 10^{16}$ helium ions/cm$^2$ to about $2 \times 10^{16}$ helium ions/cm$^2$; and in step (b), the hydrogen ions are implanted through the front surface of the monocrystalline silicon substrate at a total helium ion implantation dosage range from about $0.5 \times 10^{16}$ hydrogen ions/cm$^2$ to about $3 \times 10^{16}$ hydrogen ions/cm$^2$.

* * * * *